United States Patent

Nishimura et al.

[11] Patent Number: 5,872,389
[45] Date of Patent: Feb. 16, 1999

[54] SEMICONDUCTOR DEVICE HAVING A FUSE LAYER

[75] Inventors: Yasumasa Nishimura; Keiko Ito; Hiroyuki Takeoka; Masanao Maruta; Masaharu Moriyasu, all of Hyogo, Japan

[73] Assignee: Mitsubishi Denki Kabushiki Kaisha, Tokyo, Japan

[21] Appl. No.: 672,867

[22] Filed: Jun. 28, 1996

[30] Foreign Application Priority Data

Jan. 29, 1996 [JP] Japan .................................. 8-012778

[51] Int. Cl.⁶ .............................. H01L 27/10; H01L 29/00
[52] U.S. Cl. ........................ 257/529; 257/208; 257/209; 257/630
[58] Field of Search .................................. 257/208, 209, 257/529, 630

[56] References Cited

U.S. PATENT DOCUMENTS 4,853,758  8/1989  Fischer .
5,241,212  8/1993  Motonami et al. ...................... 257/529
5,321,300  6/1994  Usuda et al. ............................. 257/529
5,331,195  7/1994  Yukihiro ................................. 257/529
5,444,012  8/1995  Yoshizumi et al. ....................... 437/60
5,578,861  11/1996  Kinoshita et al. ...................... 257/529

FOREIGN PATENT DOCUMENTS 0 162 145  11/1985  European Pat. Off. .
6-104338  4/1994  Japan ..................................... 257/529

*Primary Examiner*—Valencia Wallace
*Attorney, Agent, or Firm*—McDermott, Will & Emery

[57] ABSTRACT

Burst pressure P of an insulating layer positioned immediately on a fuse layer is defined by using planar width W of fuse layer and thickness t of insulating layer. The value of the planar width W of fuse layer and the value of the thickness t of insulating layer are set such that the value of burst pressure P is at most about 1000 kg/cm². The value of the thickness t and the value of the planar width W are set such that the value t/W is at least 0.45 and at most 0.91. Consequently, stable fuse blowing becomes possible while reducing manufacturing cost.

8 Claims, 9 Drawing Sheets

SEMICONDUCTOR DEVICE HAVING A FUSE LAYER

BACKGROUND OF THE INVENTION

1. Field of the Invention

The present invention relates to a semiconductor device having a fuse layer, and, more specifically, to a semiconductor device having a fuse layer in which an insulating layer positioned on the fuse layer is about 1 μm in thickness.

2. Description of the Background Art

A redundancy circuit provided for repairing defects of a semiconductor device has been known. Generally, a fuse layer is formed together with the redundancy circuit, and the fuse layer is disconnected appropriately so as to replace a defective circuit with a redundant circuit.

FIG. 10 shows a specific structure of a DRAM (Dynamic Random Access Memory) as an example of a semiconductor device having a redundancy circuit. Referring to FIG. 10, a plurality of word lines WL extends in a row direction from respective row decoders 21 with word driver 22 interposed, in a memory cell array 20. A plurality of bit lines BL extend in a column direction from respective column decoders 23. Word lines WL and bit lines BL are arranged to cross each other. A memory cell MC is provided at each crossing point.

Outside the word lines WL, there is a spare word line SWL extending in the row direction from a spare decoder 24 with a spare word driver 25 interposed. At crossing points between spare word line SWL and the bit lines BL, spare memory cells SMC are provided.

Spare word line SWL, spare decoder 24 and spare word driver 25 constitute a so called redundancy circuit. A defective address comparing circuit 26 is connected to spare decoder 24, and a fuse layer is formed in defective address comparing circuit 26. The redundancy circuit is controlled by the fuse layer. A row address is input to defective address comparing circuit 26. FIG. 11 is a cross section showing the fuse layer portion and its periphery of the DRAM having such a structure. In FIG. 11, conductive layers other than the fuse layer 2 are not shown for the convenience of description.

Referring to FIG. 11, a fuse layer 2 is formed on a main surface of a semiconductor substrate 1 with an interlayer insulating layer 3a interposed. An insulating layer 3b of a silicon oxide, for example, is formed to cover fuse layer 2.

A defective circuit is repaired by appropriately disconnecting the above described fuse layer 2. Generally, laser is used to disconnect fuse layer 2. The principle of disconnecting fuse layer 2 by laser will be described.

Again referring to FIG. 11, fuse layer 2 is irradiated with laser 8. Consequently, laser is absorbed in fuse layer 2, and fuse layer 2 evaporates.

Consequently, insulating layer 3b is pushed up by the evaporating pressure of fuse layer 2 as shown in FIG. 12. When the evaporating pressure of fuse layer 2 attains to a prescribed value or higher, a crack 9 is generated in insulating layer 3b, as shown in FIG. 12. As the evaporating pressure generated by the evaporation of fuse layer 2 is further acts on the insulating layer 3b, insulating layer 3b positioned on fuse layer 2 is blown off, as shown in FIG. 13. Fuse layer 2 is disconnected through these steps.

As semiconductor devices has been miniaturized recently, planar width of the above described fuse layer 2 tends to be reduced. Therefore, there arises a problem that stable blowing of fuse layer 2 becomes difficult if the thickness t of insulating layer 3b on fuse layer 2 is as thick as about 1 μm.

In view of the foregoing, U.S. Pat. No. 4,853,758 discloses a method for facilitating blowing of fuse layer 2. According to U.S. Pat. No. 4,853,758, there is formed a recess portion at the surface of insulating layer 3b immediately on fuse layer 2, so as to reduce thickness of insulating layer 3b immediately above the fuse layer 2. This allows stable blowing of fuse layer 2.

However, in order to form such a recess as described above at the surface of insulating layer 3b, a new process step such as selective etching of insulating layer 3b becomes necessary. This makes manufacturing process complicated, resulting in increased manufacturing cost.

Alternatively, when the thickness of insulating layer 3b on fuse layer 2 is as thick as 1 μm or more, a method may be possible in which energy of the laser with which the fuse layer 2 is irradiated is increased. However, if the laser energy is set larger, there may possibly be a damage to the semiconductor substrate, for example underlying the fuse layer 2.

SUMMARY OF THE INVENTION

The present invention was made to solve the above described problems. An object of the present invention is to provide a semiconductor device having a fuse layer which allows stable fuse blowing by laser and which allows reduction in manufacturing cost even when the thickness of insulating layer 3b on fuse layer 2 is as large as about 1 μm or more.

Another object of the present invention is to provide a semiconductor device having a fuse layer which mitigates damage to the layer underlying the fuse layer caused by laser irradiation for fuse blowing, even when the thickness of insulating layer 3b on fuse layer 2 is as large as about 1 μm or more.

According to one aspect, the semiconductor device having a fuse layer in accordance with the present invention includes a redundancy circuit, a fuse layer and an insulating layer. The fuse layer controls the redundancy circuit. The insulating layer is formed to cover the fuse layer and has a thickness of at least about 1 μm. In this device, when the thickness of the insulating layer is t and planar width of fuse layer is W, the value t/W is at least 0.45 and at most 0.91.

As described above, according to one aspect, the planar width W of the fuse layer is defined with respect to the thickness t of the insulating layer such that the value t/W is at least 0.45 and at most 0.91. The inventors of the present invention have found that stable fuse blow is possible while the value t/W is within such a range. The reason why the value t/W is limited within the aforementioned range will be described. The inventors noted the evaporating pressure generated when the fuse layer evaporates at the time of laser irradiation in accordance with the fuse blowing mechanism described with reference to the conventional technique shown in FIGS. 11 to 13, and tried to define the evaporating pressure sufficient to burst the insulating layer on the fuse layer, that is, burst pressure for the insulating layer by some parameter. The inventors succeeded in defining by mathematical expression of the burst pressure for the insulating layer by using the thickness t of the insulating layer and the planar width W of the fuse layer. FIG. 2 is a graph showing the results obtained by the mathematical expression. FIG. 2 shows an example in which the insulating layer is an oxide film. However, similar tendency may be recognized when insulating layers other than the oxide film are used. Referring to FIG. 2, while the value t/W is within the aforementioned range, it can be recognized that the value of burst pressure P of insulating layer is relatively small (at most about 1000 kg/cm$^2$), and that inclination of the curve representing burst pressure P is also small. Namely, if the value t/W is kept within the aforementioned range, the value of burst pressure P can be kept small, and change in burst pressure P can be suppressed, enabling stable fuse blowing. Further, in the above described one aspect, it is not necessary to form a recessed portion at the surface of the insulating layer positioned immediately on the fuse layer, unlike U.S. Pat. No. 4,853,758. Therefore, manufacturing cost can be reduced.

According to another aspect, the semiconductor device having a fuse layer in accordance with the present invention includes a redundancy circuit, a fuse layer and an insulating layer. The redundancy circuit controls the fuse layer. The insulating layer is formed to cover the fuse layer, and it has a thickness of at least about 1 μm, where the thickness of the insulating layer is t, maximum bending stress of the insulating layer is $\sigma_{max}$, planar width of the fuse layer is W and a coefficient changing in accordance with the ratio between the length and planar width W of the fuse layer is a, the pressure P corresponding to the burst pressure of the insulating layer is represented by the following equation.

$$P = \frac{\sigma_{max} t^2}{6\alpha W^2} \tag{1}$$

The planar width W of the fuse layer with respect to the thickness t of the insulating layer is determined to satisfy the relation as represented by the equation (1).

As described above, according to this aspect, the value of pressure P corresponding to the burst pressure of the insulating layer is defined by using the thickness t of the insulating layer and the planar width W of the fuse layer. This relation can be calculated by assuming that the insulating layer on the fuse layer is a flat plate and by defining, in terms of mathematical expression, maximum bending stress when uniformly distributed load is applied to the bottom surface of the flat plate. Therefore, when a pressure higher than the above described value of the pressure P is applied to the insulating layer on the fuse layer, it is possible to blow off the insulating layer. In other words, the value of minimum pressure P necessary for blowing the fuse can be obtained. This means that it is possible to appropriately adjust the energy of the laser with which the fuse layer is irradiated, in accordance with the value of pressure P. As a result, the damage to the material under the fuse layer caused by laser irradiation can be mitigated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to FIGS. 1 to 9.

(First Embodiment)

Figure 1:
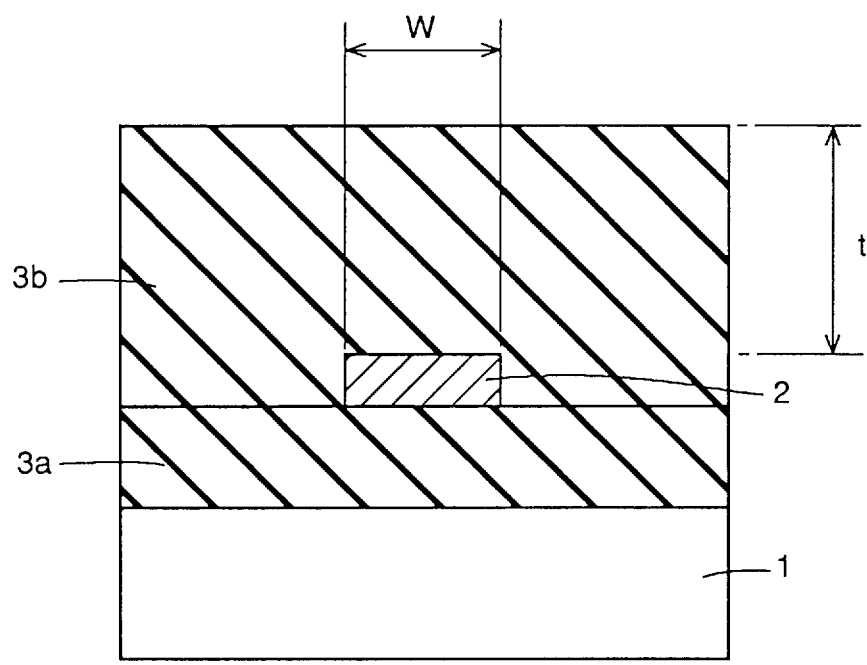
FIG. 1 is a partial cross section of a semiconductor device having a fuse layer in accordance with a first embodiment of the present invention.

First, referring to FIGS. 1 and 2, the first embodiment of the present invention will be described. FIG. 1 is a partial cross section of the semiconductor device having a fuse layer in accordance with the first embodiment.

Referring to FIG. 1, on a main surface of semiconductor substrate 1, fuse layer 2 is formed with interlayer insulating layer 3a interposed. The material for fuse layer 2 may be tungsten silicide or the like. Planar width of fuse layer 2 is represented by W.

Insulating layer 3b of, for example, silicon oxide is formed to cover fuse layer 2. Insulating layer 3b may be formed of an insulating layer other than silicon oxide. However, in the following, it is assumed that insulating layer 3b is formed of silicon oxide. Further, in the present invention, it is assumed that the thickness t of insulating layer 3b positioned on fuse layer 2 is relatively large, that is, at least about 1 μm.

In order to stably blow the fuse layer 2 without performing any process to reduce thickness of insulating layer 3b when insulating layer 3b has relatively large thickness t of about 1 μm or more, the inventors of the present invention took consideration of the following.

Figure 13:
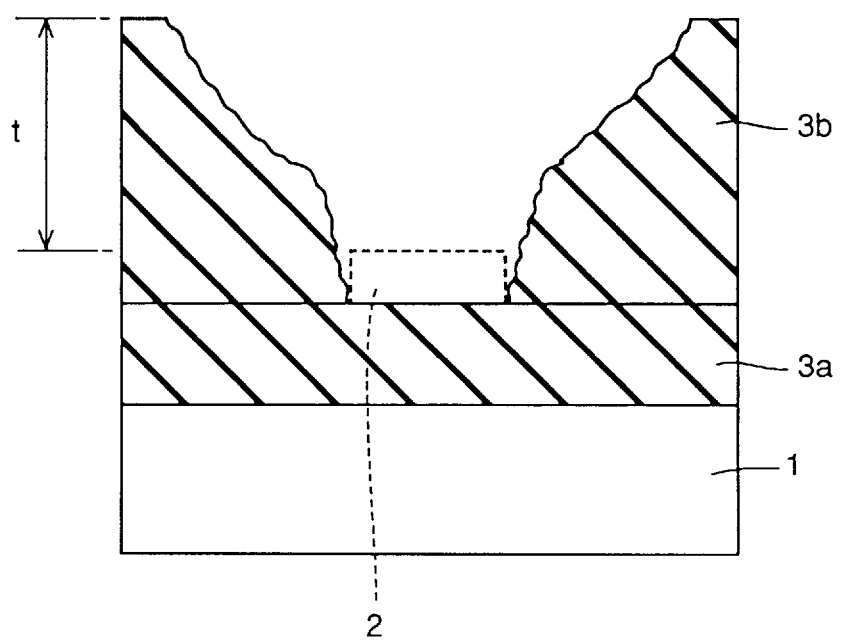
FIG. 13 is a cross section showing the conventional semiconductor device having a fuse layer after fuse blowing.

In order to blow the fuse layer 2, it is necessary to blow insulating layer 3b immediately on fuse layer 2 as shown in FIG. 13, which was referred to above. Therefore, the inventors paid attention to the pressure necessary for blowing the insulating layer 3b (hereinafter referred to as: burst pressure), and tried to find the burst pressure.

Then, the inventors conceived the following model. Namely, it is assumed that insulating layer 3b immediately on fuse layer 2 is a flat plate, and that uniformly distributed load is applied to the bottom surface of the flat plate. Silicon oxide is selected as the material of the flat plate. When maximum bending moment of the assumed flat plate, hereinafter referred to as virtual flat plate, is represented by $M_{max}$ and maximum bending stress is represented by $\sigma_{max}$, maximum bending stress can be represented by the following equation.

$$\sigma_{max} = \frac{6M_{max}}{t^2} \quad (2)$$

In equation (2) above, t represents thickness of the virtual flat plate, that is, the thickness corresponding to the thickness of the insulating layer 3b on fuse layer 2. The maximum bending moment is represented by the following.

$$M_{max} = \alpha PW^2 \quad (3)$$

In the equation (3) above, the reference character P represents uniformly distributed load applied to the bottom surface of the virtual flat plate, W represents planar width of fuse layer 2 and α is a coefficient. This α is a coefficient which changes in accordance with the ratio 1/W of the length 1 and planar width W of fuse layer 2 when Poisson's ratio is 0.3. Table 1 below shows the value of this coefficient.

TABLE 1

| 1/W | Coefficient: α |
|---|---|
| 1.00 | 0.0513 |
| 1.25 | 0.0665 |
| 1.50 | 0.0757 |
| 1.75 | 0.0817 |
| 2.00 | 0.0829 |
| ∞ | 0.0833 |

From the equations (2) and (3), the value P will be $$P = \frac{\sigma_{max} t^2}{6\alpha W^2} \quad (1)$$

It can be seen from equation (1) that the value P is represented by using the thickness t of insulating layer 3b and planar width W of fuse layer 2. It may be considered that the value P corresponds to the burst pressure of insulating layer 3b when fuse layer 2 evaporates as it is irradiated with laser.

As the relation between each of the value P, the thickness t of insulating layer 3b and the planar width W of fuse layer 2 is represented by a mathematical expression, it becomes possible to calculate minimum value P necessary for blowing the fuse layer 2. Accordingly, the energy of laser used for irradiating fuse layer 2 can be set at a minimum value, and hence damage to the underlying layer below fuse layer 2 caused by laser can be mitigated.

Figure 2:
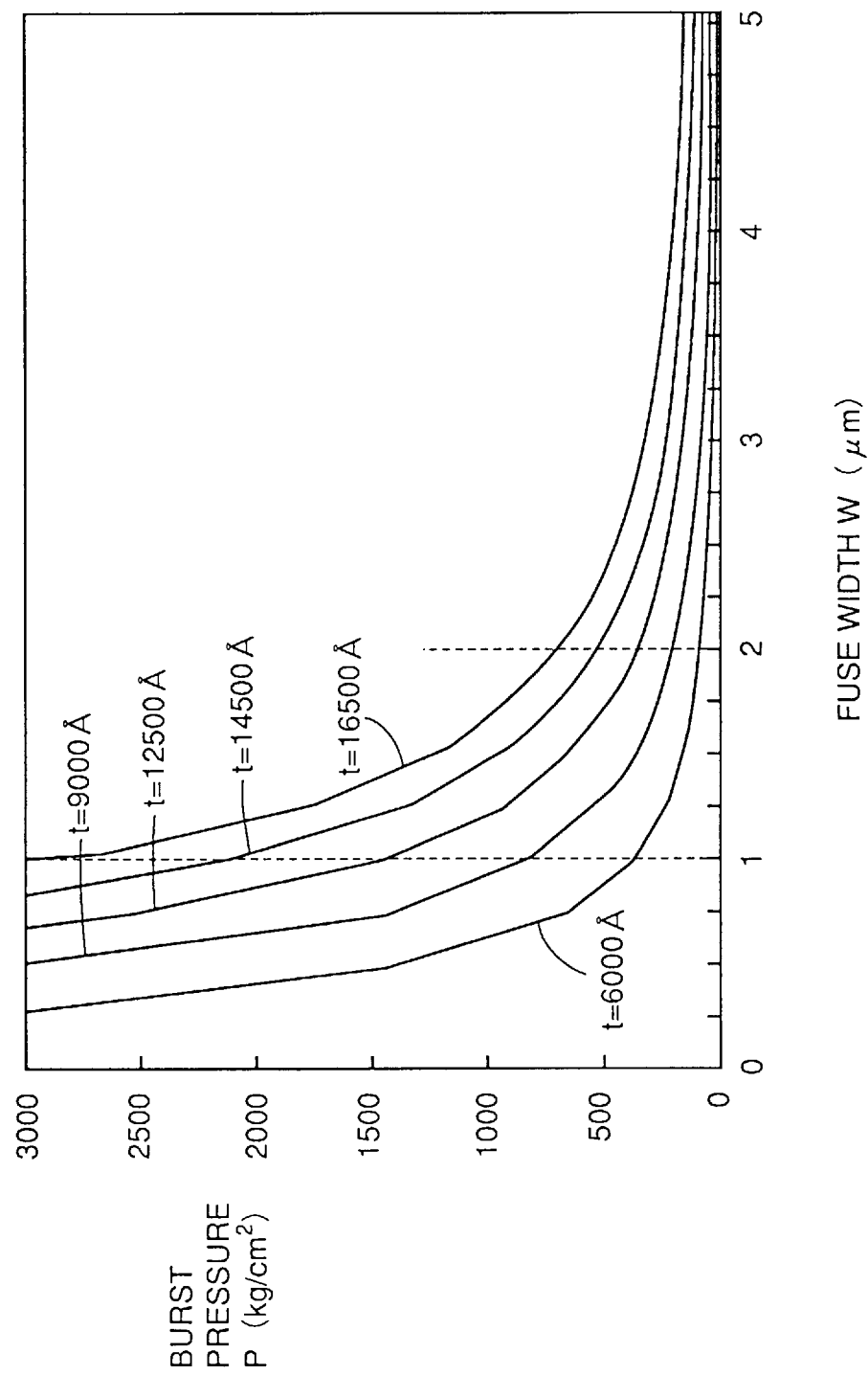
FIG. 2 is a graph showing relation between each of burst pressure P for the insulating layer, planar width W of the fuse layer and the thickness t of the insulating layer.

FIG. 2 shows the results obtained by the equation (1) above. FIG. 2 shows the results when the thickness of insulating layer 3b is from about 6000 Å to about 16,500 Å, with the length of fuse layer 2 being 5 μm. Referring to FIG. 2, the larger the planar width W of fuse layer 2, the smaller the value of the burst pressure P, and the smaller the inclination of the curve representing the burst pressure P. It is understood that the smaller the value of burst pressure P, the easier becomes fuse blowing, and the smaller the inclination of burst pressure P, the more stable becomes fuse blowing.

More specifically, if the burst pressure P is at most about 1000 kg/cm², fuse blowing can be performed stably and easily. More preferably, the burst pressure P is at most about 500 kg/cm².

Further, the inventors studied the relation between the thickness t of insulating layer 3b and the planar width W of fuse layer 2 which could suppress burst pressure P to at most about 1000 kg/cm². As a result, the inventors reached a conclusion that the burst pressure P could be suppressed to at most about 1000 kg/cm² allowing stable fuse blowing if the value t/w was at least about 0.45 and at most about 0.91.

In order to confirm the above conclusion, the inventors performed an experiment within a certain range. Specifically, the thickness t of insulating layer 3b was set from about 1 μm to about 1.6 μm, and planar width W of fuse layer 2 was set to be about 1.6 μm to about 2.2 μm. Fuse blowing was actually carried out and satisfactory results could be obtained. Then, the data obtained through experiment was compared with the graph shown in FIG. 2, and reliability of the graph shown in FIG. 2 was appreciated. As already described, the value t/W should preferably be at least about 0.45 and at most about 0.91. However, from the data of experiment, it is considered that stable fuse blowing is possible provided that the value t/W is at most about 1.

As described above, in the first embodiment of the present invention, stable fuse blowing is possible without performing any process to reduce thickness of the insulating layer 3b positioned directly on the fuse layer 2. Therefore, as compared with the technique disclosed in U.S. Pat. No. 4,853,758, manufacturing cost can be reduced.

(Second Embodiment)

Figure 3:
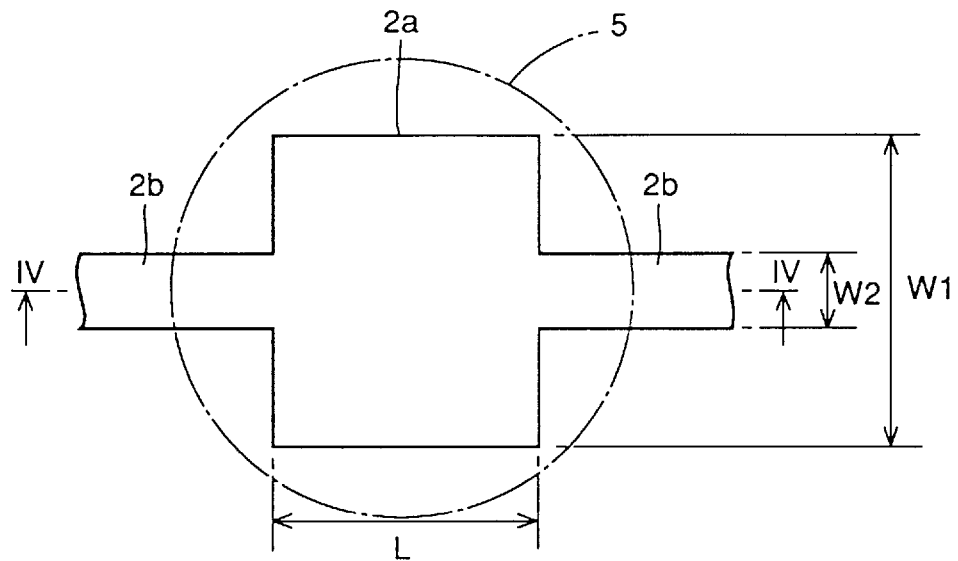
FIG. 3 is a plan view showing a fuse layer in accordance with the second embodiment of the present invention.
Figure 4:
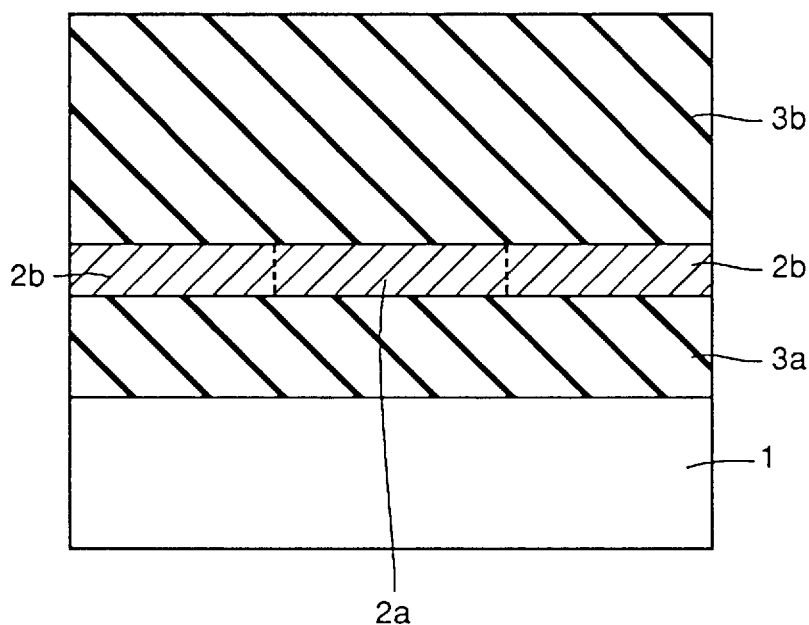
FIG. 4 is a cross section taken along the line IV—IV of FIG. 3.

The second embodiment of the present invention will be described with reference to FIGS. 3 to 7. FIG. 3 is a partial plan view of the fuse layer in accordance with the second embodiment of the present invention. FIG. 4 is a cross section taken along the line IV—IV of FIG. 3.

Referring to FIGS. 3 and 4, in the second embodiment, fuse layer 2 has a first portion 2a having relatively large planar width W1 and a second portion 2b having relatively small planar width W2. A pair of second portions 2b are provided on both sides of the first portion 2a.

In order to blow the fuse layer 2 having such a structure, the fuse layer 2 is irradiated with laser such that the first portion 2a is positioned in a laser spot 5, as shown in FIG. 3. Consequently, laser is absorbed by the first portion 2a and the second portion 2b near the first portion 2a. At this time, since the planar width W1 of the first portion 2a is larger than the planar width W2 of the second portion 2b, the burst pressure P of insulating layer 3b on the first portion 2a becomes relatively small, because of the relation shown in FIG. 2.

More specifically, if the burst pressure P for insulating layer 3b on the first portion 2a is set to be about 1000 kg/cm², a burst pressure larger than 1000 kg/cm² is necessary to burst the insulating layer 3b on the second portion 2b. Therefore, it is possible to blow the first portion 2a. Actually, in some cases the second portion 2b may be partially blown near the first portion 2a. However, most of the second portion 2b would remain.

Figure 5:
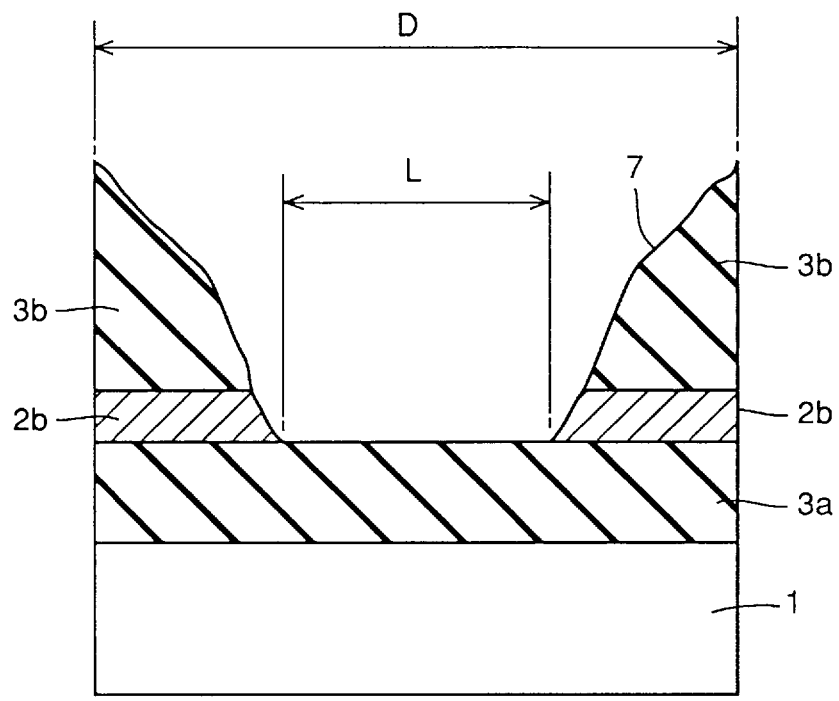
FIG. 5 is a cross section showing the semiconductor device of FIG. 4 after the fuse layer is blown.

FIG. 5 is a cross section of the semiconductor device after the first portion 2a is blown. Referring to FIGS. 3 and 5, since mainly the first portion 2a is blown as described above, it becomes possible to reduce the maximum diameter D of blown hole 7 by making small the length L of the first portion 2a.

The relation between the planar width W1 and the planar width W2 will be more specifically described. Table 2 below shows values of planar widths W1 and W2 and the value of maximum diameter D of the blown hole. The value shown in Table 2 are calculated from the data of the experiment actually performed by the inventors and the graph shown in FIG. 2. As for the conditions, laser energy was 0.6 μJ, the length L of the first portion 2a was about 4 μm and the spot diameter of laser was about 6 μm.

TABLE 2

| Planar width: W1 (μm) | | 2 | 2 | 2 | 2 |
|---|---|---|---|---|---|
| Planar width: W2 (μm) | | 0.5 | 1 | 1.5 | 2 |
| Maximum diameter of | t = 1.6 (μm) | 12 | 12 | 12.5 | 13.2 |
| blown hole: D (μm) | t = 1.4 (μm) | 11.4 | 11.6 | 12 | 12.3 |

As shown in Table 2 above, it is understood that the smaller the value of the planar width W, the smaller the maximum diameter D of the blown hole. Specially when the value W1/W2 is 2 or more, the value of the maximum diameter D of the blown hole is significantly reduced. Therefore, by appropriately selecting the values of planar widths W1 and W2 to have such a ratio, the value of the maximum diameter D of the blown hole can be effectively reduced.

Figure 6:
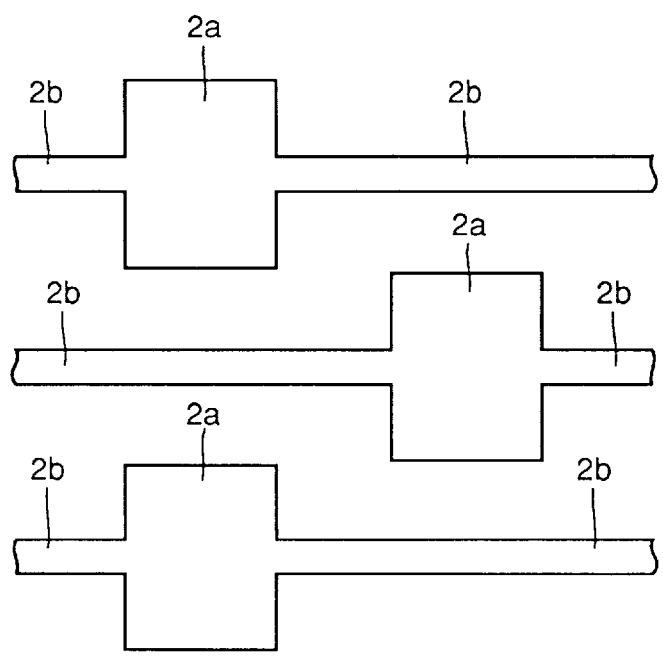
FIG. 6 is a plan view showing an example of arrangement of the fuse layer shown in FIG. 3.

An example of arrangement of the fuse layer in accordance with the present embodiment will be described in the following. FIG. 6 is a plan view showing an example of arrangement of the fuse layer in accordance with the second embodiment.

Referring to FIG. 6, three fuse layers 2 are formed approximately parallel to each other in the longitudinal direction. The fuse layers 2 are arranged such that the first portions 2a and the second portions 2b are positioned alternately in the width direction of the fuse layer 2. Therefore, as compared with an example in which fuse layers have uniform planar width, the space between fuse layers 2 can be narrowed.

Figure 7:
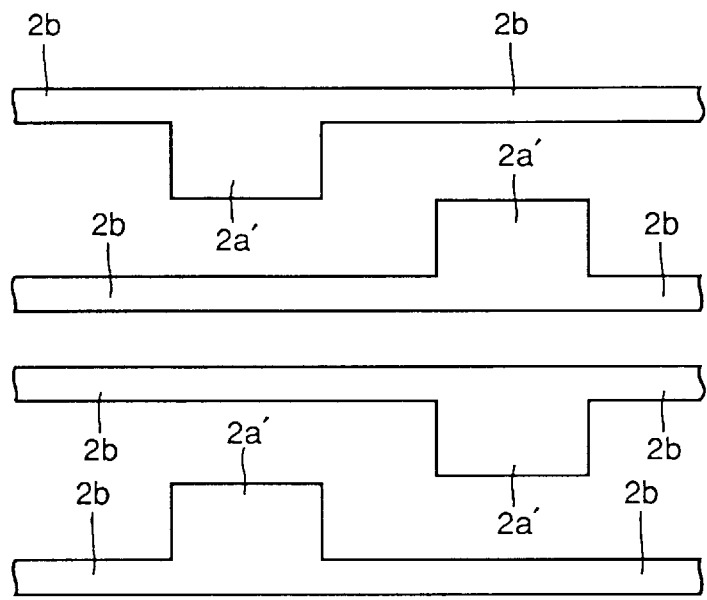
FIG. 7 is a plan view showing an example of arrangement of a modification of the fuse layer shown in FIG. 3.

A modification of fuse layer 2 and an example of arrangement of the modification will be described. FIG. 7 is a plan view showing an arrangement of the modified fuse layers 2. As shown in FIG. 7, the first portion 2a' is provided protruding in the width direction from one side of fuse layer 2. By the provision of such first portion 2a', the space between fuse layers 2 can be made narrower than shown in FIG. 6.

(Third Embodiment)

Figure 8:
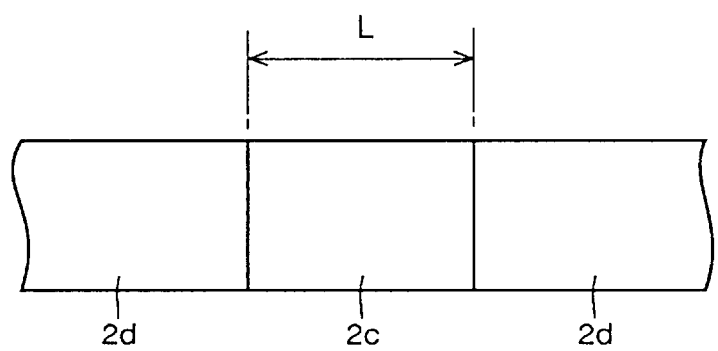
FIG. 8 is a plan view showing a fuse layer in accordance with a third embodiment of the present invention.

The third embodiment of the present invention will be described with reference to FIG. 8. FIG. 8 is a plan view showing a fuse layer in accordance with the third embodiment of the present invention.

Referring to FIG. 8, in the third embodiment, the fuse layer 2 has a high absorbing portion 2c and a low absorbing portion 2d. A pair of low absorbing portions 2d are provided on both sides of a high absorbing portion 2c. High absorbing portion 2c is formed of a material having relatively large laser absorption coefficient, such as tungsten silicide or titanium silicide. Low absorbing portion 2d is formed of a material having relatively small laser absorption coefficient, such as amorphous silicon or polycrystalline silicon.

In order to blow the fuse layer 2 having the above described structure, fuse layer 2 is irradiated with laser such that high absorbing portion 2c is positioned within the laser spot. Consequently, laser is efficiently absorbed at high absorbing portion 2c, and high absorbing portion 2c evaporates with priority. Therefore, the high absorbing portion 2c can be selectively blown.

Similar to the second embodiment described above, in the third embodiment, the length L of the high absorbing portion 2c can be made smaller in order to reduce the maximum diameter D of the blown hole.

(Fourth Embodiment)

Figure 9A:
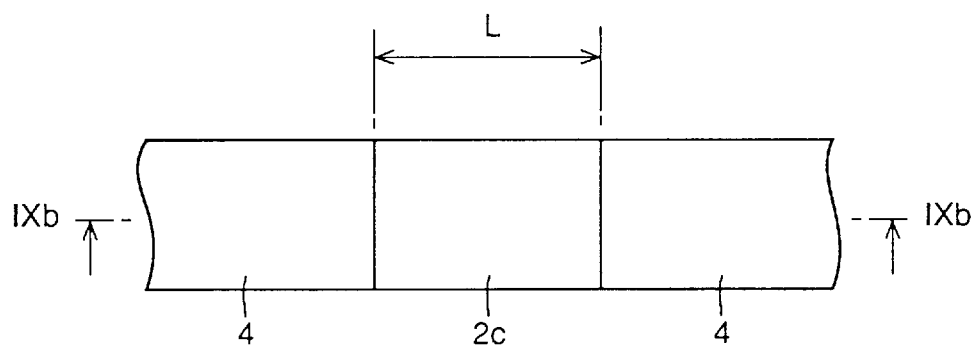
FIG. 9A is a plan view showing a fuse layer in accordance with a fourth embodiment of the present invention.
Figure 9B:
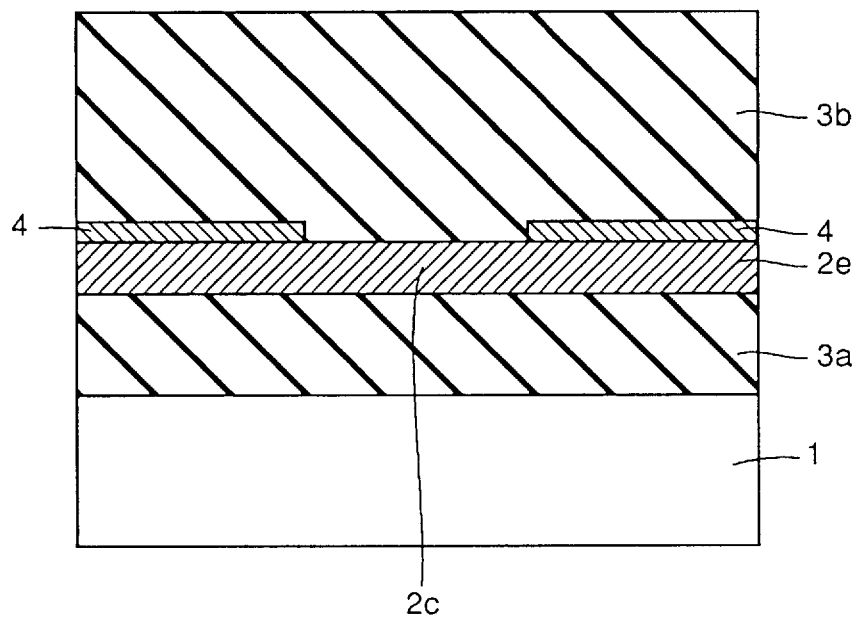
FIG. 9B is a cross section taken along the line IXb—IXb of FIG. 9A.
Figure 10:
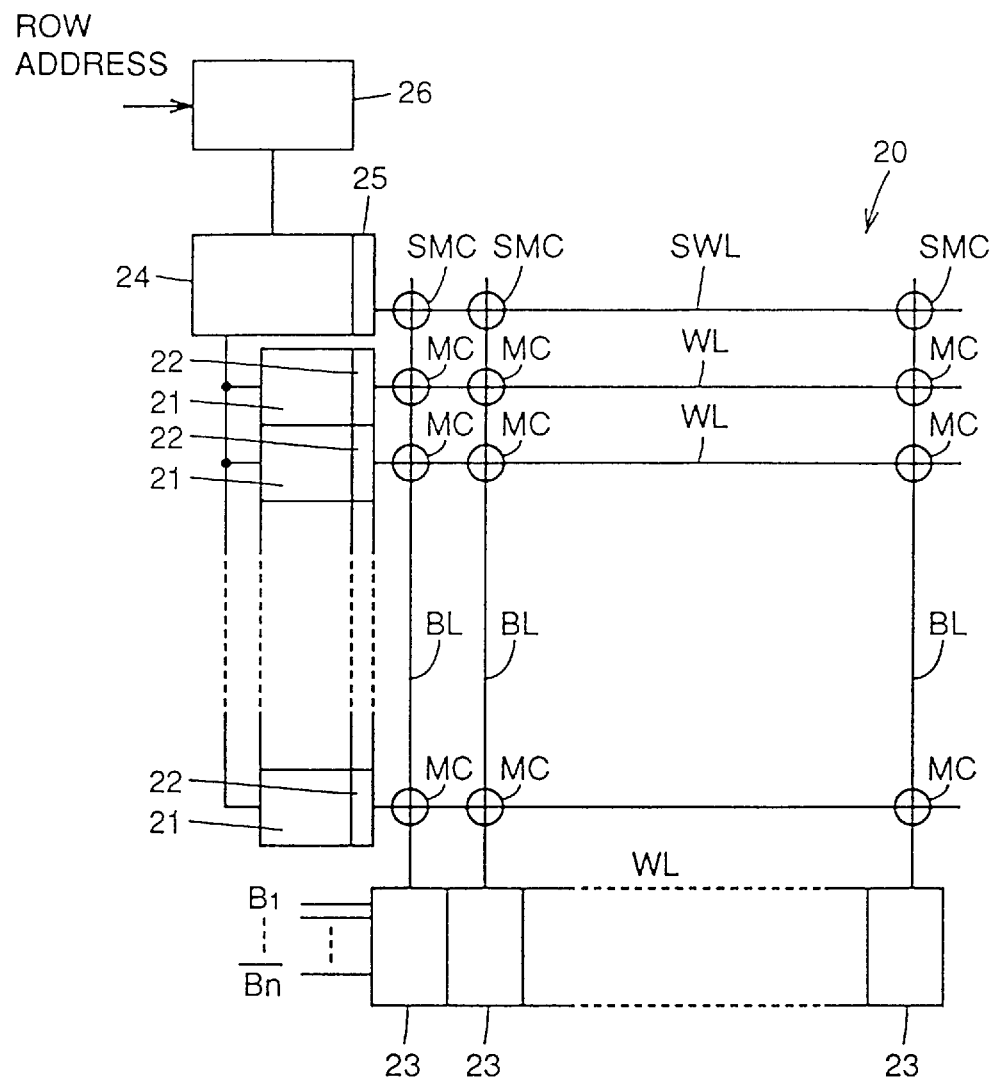
FIG. 10 is a block diagram showing a schematic structure of a conventional DRAM having a fuse layer.
Figure 11:
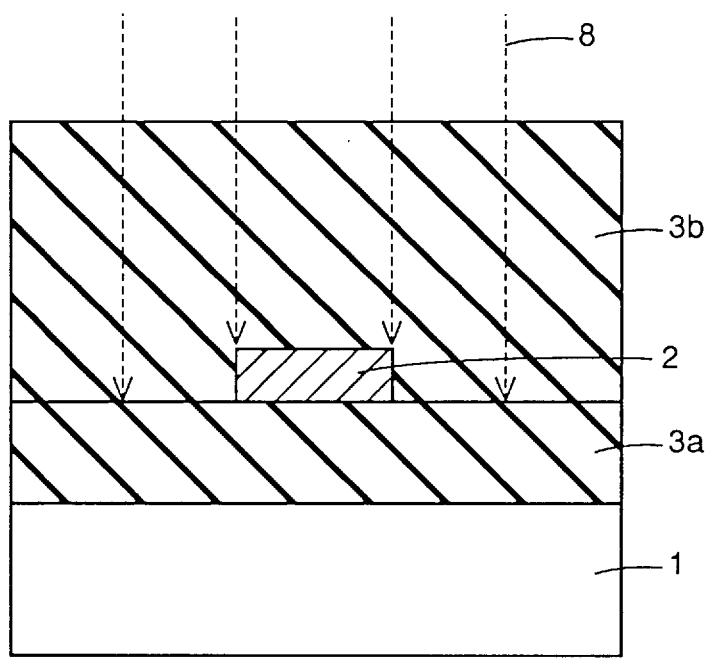
FIG. 11 is a partial cross section showing a conventional semiconductor device having a fuse layer.
Figure 12:
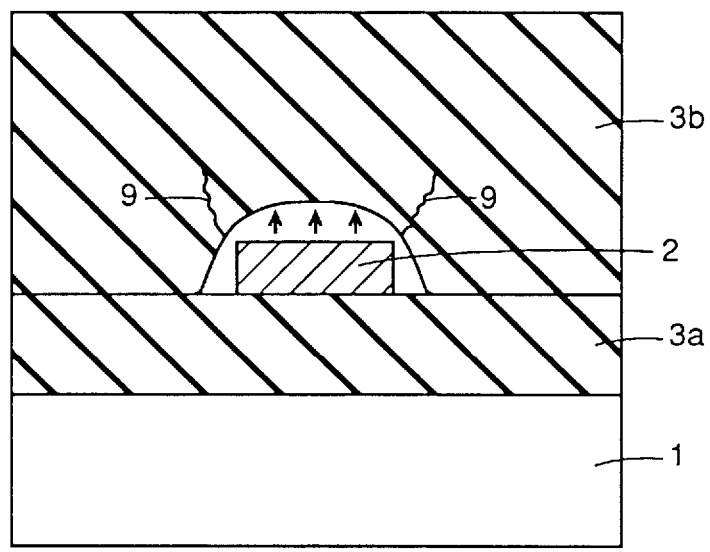
FIG. 12 is a cross section showing the manner of fuse blowing in the conventional semiconductor device having a fuse layer.

Referring to FIGS. 9A and 9B, the fourth embodiment will be described. FIG. 9A is a plan view showing fuse layer 2 in accordance with the fourth embodiment of the present invention. FIG. 9B is a cross section taken along the line IXb—IXb of FIG. 9A.

Referring to FIG. 9A, in the fourth embodiment, a reflective film 4 is formed selectively on the surface of fuse layer 2. More specifically, in order that a portion of fuse layer 2 is used as a high absorbing portion 2c, reflective films 4 of Al, for example, are formed spaced from each other, on both sides of the high absorbing portion 2c. The reflective film 4 should preferably be a film having a reflectance of at least about 50% when irradiated with laser.

Referring to FIG. 9B, the fuse layer 2 in accordance with the fourth embodiment is provided by selectively forming reflective film 4 on a layer 2e which is formed of a material having relatively large laser absorption coefficient. In other words, the base of the fuse layer 2 in accordance with the fourth embodiment is formed by a layer 2e of a material having relatively large laser absorption coefficient.

Because of the structure described above, it becomes possible to selectively blow the high absorbing portion 2c, based on the same principle as the third embodiment. Further, by setting the length L of high absorbing portion 2c small, it becomes possible to reduce the maximum diameter D of the blown hole, as in the third embodiment above.

Though insulating layer 3b is formed of silicon oxide in the above described embodiments, the concept of the present invention can be applied even when the insulating layer 3b is formed of other materials such as silicon nitride.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a fuse layer, comprising:

a redundancy circuit;

a fuse layer controlling said redundancy circuit; and an insulating layer having a thickness of at least about 1 μm formed to cover said fuse layer; wherein pressure P corresponding to burst pressure for said insulating layer is represented as $$P = \frac{\sigma_{max} t^2}{6\alpha W^2} \tag{1}$$

where t is thickness of said insulating layer, $\sigma_{max}$ is maximum bending stress of said insulating layer, W is planar width of said fuse layer and a is a coefficient changing in accordance with ratio between said planar width W and length of said fuse layer, and the planar width W of said fuse layer is determined with respect to the thickness t of said insulating layer to satisfy the relation defined by said equation (1).

2. The semiconductor device having a fuse layer according to claim 1, wherein the thickness t of said insulating layer and the planar width W of said fuse layer are determined so that the value of said pressure P is at most 1000 kg/cm².

3. The semiconductor device having a fuse layer according to claim 1, wherein said fuse layer includes a first portion having a first planar width, and a pair of second portions having a second planar width smaller than the first planar width provided on both sides of said first portion, and thickness of said insulating layer and said first planar width are determined such that burst pressure for said insulating layer on said first portion is at most 1000 kg/cm².

4. A semiconductor device having a fuse layer, comprising:

a redundancy circuit;

a fuse layer controlling said redundancy circuit; and an insulating layer having a thickness of at least about 1 μm formed to cover said fuse layer; wherein value t/W is at least 0.45 and at most 0.91 where t is thickness of said insulating layer and W is planar width of said fuse layer, wherein a reflective film comprising spaced apart portions having a reflectance of at least about 50% when irradiated with a laser is selectively formed on the surface of said fuse layer.

5. A semiconductor device having a fuse layer, which semiconductor device comprises:

a redundancy circuit;

a fuse layer controlling said redundancy circuit;

an insulating layer covering said fuse layer; and a reflective film comprising spaced apart portions having a reflectance of at least about 50% when irradiated with a laser selectively formed on the surface of said fuse layer.

6. The semiconductor device according to claim 5, wherein said insulating layer has a thickness of at least about 1 μm.

7. A semiconductor device having a fuse layer, comprising:

a redundancy circuit;

a fuse layer controlling said redundancy circuit;

an insulating layer having a thickness of at least about 1 μm formed to cover said fuse layer; and a reflective film comprising spaced apart portions selectively formed on the surface of said fuse layer; whereby layers including said fuse layer and said reflective film have a high absorbing portion having relatively large laser absorption coefficient and a low absorbing portion having relatively small said absorption coefficient, wherein value t/w is at least 0.45 and at most 0.91 where t is thickness of said insulating layer and w is planar width of said fuse layer.

8. A semiconductor device having a fuse layer, which semiconductor device comprises:

a redundancy circuit;

a fuse layer controlling said redundancy circuit;

an insulating layer covering said fuse layer; and a reflective film comprising spaced apart portions selectively formed on the surface of said fuse layer; whereby layers including said fuse layer and said reflective film have a high absorbing portion having relatively large laser absorption coefficient and a low absorbing portion having relatively small said absorption coefficient.

* * * * *